(12) United States Patent
Sung et al.

(10) Patent No.: US 9,231,222 B2
(45) Date of Patent: Jan. 5, 2016

(54) THIN FILM TRANSISTOR AND METHOD OF MANUFACTURING THE SAME

(75) Inventors: Woo-Yong Sung, Seoul (KR); Dong-Hwan Kim, Asan-si (KR); Jeong-Ho Lee, Seoul (KR); Tae-Woon Cha, Seoul (KR); Sang-Gun Choi, Suwon-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 13/584,938

(22) Filed: Aug. 14, 2012

(65) Prior Publication Data

US 2013/0175505 A1    Jul. 11, 2013

(30) Foreign Application Priority Data

Jan. 10, 2012   (KR) .............................. 2012-0002996

(51) Int. Cl.
*H01L 29/78*  (2006.01)
*H01L 21/441* (2006.01)
*H01L 51/05*  (2006.01)

(52) U.S. Cl.
CPC .................................. *H01L 51/0541* (2013.01)

(58) Field of Classification Search
CPC .............. H01L 29/66765; H01L 29/7781; H01L 29/78669; H01L 29/78678; H01L 51/0545
USPC ....................... 257/40, 41, 642, 759, E39.007, 257/E51.011, E51.015, E27.117, 29, 257/E29.247, E29.291, E29.294, E21.414; 438/82, 99, 623, 666, 780, 158, 438/FOR. 18

See application file for complete search history.

(56) References Cited

U.S. PATENT DOCUMENTS

| | | | |
|---|---|---|---|
| 6,794,220 B2 * | 9/2004 | Hirai et al. ...................... | 438/99 |
| 7,019,328 B2 | 3/2006 | Chabinyc et al. | |
| 2002/0164881 A1 * | 11/2002 | Nambu ......................... | 438/714 |
| 2005/0045885 A1 * | 3/2005 | Kim et al. ...................... | 257/66 |
| 2006/0202214 A1 * | 9/2006 | Yang .............................. | 257/88 |
| 2007/0080346 A1 * | 4/2007 | Kim et al. ...................... | 257/40 |
| 2009/0032892 A1 * | 2/2009 | Hsiao et al. ................... | 257/431 |
| 2009/0302321 A1 * | 12/2009 | Park et al. ...................... | 257/66 |
| 2010/0237443 A1 * | 9/2010 | Noh et al. ..................... | 257/411 |
| 2011/0084252 A1 * | 4/2011 | Wu et al. ........................ | 257/40 |
| 2011/0180790 A1 * | 7/2011 | Nakano et al. ................. | 257/40 |
| 2012/0280236 A1 * | 11/2012 | Kim ............................... | 257/59 |
| 2013/0001556 A1 * | 1/2013 | Hu et al. ........................ | 257/53 |

FOREIGN PATENT DOCUMENTS

| | | |
|---|---|---|
| JP | 2010-199130 | 9/2010 |
| KR | 0719569 | 5/2007 |

* cited by examiner

*Primary Examiner* — Julio J Maldonado
*Assistant Examiner* — Moazzam Hossain
(74) *Attorney, Agent, or Firm* — F. Chau & Associates, LLC

(57) ABSTRACT

A thin film transistor ("TFT") includes a gate electrode, a gate insulating layer, a source electrode, a drain electrode and a semiconductor layer. The gate insulating layer is disposed on the gate electrode. The source electrode is disposed on the gate insulating layer. The drain electrode is disposed on the gate insulating layer. The drain electrode is spaced apart from the source electrode. The semiconductor layer is disposed on the gate insulating layer. The semiconductor layer makes contact with a side surface of the source electrode and a side surface of the drain electrode.

23 Claims, 19 Drawing Sheets

THIN FILM TRANSISTOR AND METHOD OF MANUFACTURING THE SAME

CROSS-REFERENCE TO RELATED APPLICATION

This application claims priority to Korean Patent Application No. 2012-0002996, filed on Jan. 10, 2012, the disclosure of which is hereby incorporated by reference herein in its entirety.

1. Technical Field

Exemplary embodiments of the present invention relate to a thin film transistor and a method of manufacturing the thin film transistor. More particularly, exemplary embodiments of the present invention relate to a thin film transistor decreasing a resistance and an area and simplifying a manufacturing process and a method of manufacturing the thin film transistor.

2. Discussion of the Related Art

A display apparatus may include, for example, an array substrate including a switching element and an opposite substrate facing the array substrate. The switching element may include a gate electrode electrically connected to a gate line, a semiconductor layer insulated from the gate electrode, a source electrode electrically connected to a data line and the semiconductor layer, and a drain electrode spaced apart from the source electrode and electrically connected to the semiconductor layer.

Due to a resistance of a gate conductive pattern including the gate electrode and a gate line connected to the gate electrode and a resistance of a data conductive pattern including the source electrode, the drain electrode and a data line connected to the source electrode, a driving speed of a display panel may decrease.

When areas of the gate conductive pattern and the data conductive pattern increase to increase the driving speed of the display panel, an aperture ratio of the display panel may decrease.

In addition, the gate conductive pattern, the data conductive pattern and the semiconductor layer may be manufactured using vacuum conditions so that a manufacturing process may be relatively complicated and manufacturing costs may thereby increase.

SUMMARY

Exemplary embodiments of the present invention may provide a thin film transistor ("TFT") which includes a relatively thick conductive pattern to decrease a resistance and an area of the TFT. In addition, a soluble semiconductor material may be included with the TFT to simplify a manufacturing process for forming the TFT.

Exemplary embodiments of the present invention may also provide a method of manufacturing the TFT.

In an exemplary embodiment of a TFT according to the present invention, the TFT includes a gate electrode, a gate insulating layer, a source electrode, a drain electrode and a semiconductor layer. The gate insulating layer is disposed on the gate electrode. The source electrode is disposed on the gate insulating layer. The drain electrode is disposed on the gate insulating layer. The drain electrode is spaced apart from the source electrode. The semiconductor layer is disposed on the gate insulating layer. The semiconductor layer makes contact with a side surface of the source electrode and a side surface of the drain electrode.

In an exemplary embodiment, the semiconductor layer may include a soluble semiconductor material.

In an exemplary embodiment, the semiconductor layer may include at least one of an oxide semiconductor, a graphene or a carbon nanotube.

In an exemplary embodiment, the semiconductor layer may be disposed on a plane substantially the same as the source electrode and the drain electrode.

In an exemplary embodiment, a thickness of the source electrode may be between about 1 µm and about 3 µm. A thickness of the drain electrode may be between about 1 µm and about 3 µm.

In an exemplary embodiment, a thickness of the gate electrode may be between about 1 µm and about 3 µm.

In an exemplary embodiment, a thickness of the gate electrode may be greater than a thickness of the source electrode and a thickness of the drain electrode.

In an exemplary embodiment, the TFT may further include a passivation layer disposed on the source electrode, the drain electrode and the semiconductor layer.

In an exemplary embodiment, the passivation layer may include a silicon oxide.

In an exemplary embodiment, the TFT may further include a first organic layer making contact with opposing side surfaces of the gate electrode.

In an exemplary embodiment of a method of manufacturing a TFT according to the present invention, the method includes forming a gate electrode in a first trench disposed in a first organic layer, forming a gate insulating layer on the gate electrode, and forming a source electrode in a second trench disposed in a second organic layer located on the gate insulating layer and a drain electrode in a third trench disposed in the second organic layer. The drain electrode is spaced apart from the source electrode on the gate insulating layer. The method further includes forming a semiconductor layer on the gate insulating layer. The semiconductor layer makes contact with a side surface of the source electrode and a side surface of the drain electrode.

In an exemplary embodiment, the forming of the semiconductor layer may include printing a soluble semiconductor material between the source electrode and the drain electrode.

In an exemplary embodiment, the semiconductor layer may include at least one of an oxide semiconductor, a graphene or a carbon nanotube.

In an exemplary embodiment, the semiconductor layer may be disposed on a plane substantially the same as the source electrode and the drain electrode.

In an exemplary embodiment, the forming of the gate electrode may include printing a conductive ink in the first trench.

In an exemplary embodiment, the forming of the source electrode and the drain electrode may include printing a conductive ink in the second trench and the third trench, respectively.

In an exemplary embodiment, a thickness of the source electrode may be between about 1 µm and about 3 µm. A thickness of the drain electrode may be between about 1 µm and about 3 µm.

In an exemplary embodiment, a thickness of the gate electrode may be between about 1 µm and about 3 µm.

In an exemplary embodiment, a thickness of the gate electrode may be greater than a thickness of the source electrode and a thickness of the drain electrode.

In an exemplary embodiment, the method may further include forming a passivation layer on the source electrode, the drain electrode and the semiconductor layer.

In an exemplary embodiment, the passivation layer may include a silicon oxide.

In an exemplary embodiment, the first organic layer may make contact with opposing side surfaces of the gate electrode.

In accordance with an exemplary embodiment of the present invention, a method of manufacturing a thin film transistor ("TFT") is provided. The method includes forming a first organic layer on a substrate, forming a first trench in the first organic layer; forming a gate electrode in the first trench of the first organic layer, forming a gate insulating layer on the gate electrode, forming a second organic layer on the gate insulating layer, forming a second trench and a third trench in the second organic layer, forming a source electrode in the second trench of the second organic layer and a drain electrode in the third trench of the second organic layer and etching the second organic layer to form a gap between the source electrode and the drain electrode which exposes a portion of the gate insulating layer.

In addition, the method further includes forming a semiconductor layer on the exposed portion of the gate insulating layer in the gap between the source electrode and the drain electrode, forming a passivation layer on the source electrode, the drain electrode and the semiconductor layer and forming a planarizing layer on the passivation layer.

With a TFT and a method of manufacturing the TFT according to an exemplary embodiment of the present invention, the gate electrode, the source electrode and the drain electrode may have a thick thickness so that resistance and area of the TFT may be increased.

In addition, the gate electrode, the source electrode and the drain electrode are formed using an organic layer including a trench and the semiconductor layer includes a soluble semiconductor material so that a process of manufacturing the TFT may be simplified and manufacturing costs of the TFT may decrease.

BRIEF DESCRIPTION OF THE DRAWINGS

Exemplary embodiments of the present invention can be understood in more detail from the following detailed description taken in conjunction with the accompanying drawings, in which.

DETAILED DESCRIPTION OF EXEMPLARY EMBODIMENTS

Figure 1:
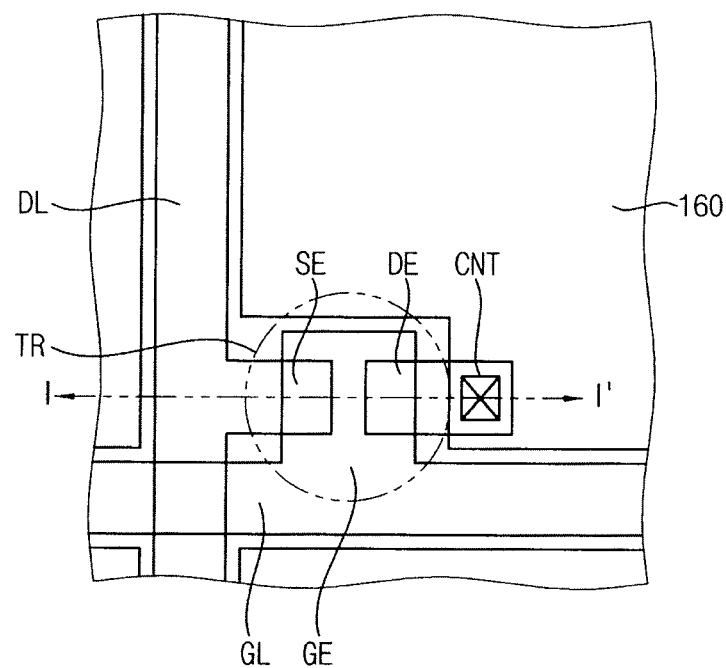
FIG. 1 is a plan view illustrating an array substrate according to an exemplary embodiment of the present invention.

Hereinafter, exemplary embodiments of the present invention will be described in further detail with reference to the accompanying drawings.

In the drawings, the thickness of layers, films, panels, regions, etc., may be exaggerated for clarity. It will be understood that when an element such as, for example, a layer, film, region, or substrate is referred to as being "on", "connected to" or "coupled to" another element, it can be directly on, connected to or coupled to the other element or intervening elements may also be present. Like reference numerals designate like elements throughout the specification.

As used herein, the singular forms, "a", "an", and "the" are intended to include plural forms as well, unless the context clearly indicates otherwise.

FIG. 1 is a plan view illustrating an array substrate according to an exemplary embodiment of the present invention.

Referring to FIG. 1, the array substrate includes, for example, a gate line GL formed on a base substrate, a data line DL, a thin film transistor ("TFT") TR and a pixel electrode 160.

The gate line GL may extend in a first direction. The array substrate may include a plurality of the gate lines GL. The data line DL may extend in a second direction crossing the first direction. The array substrate may include a plurality of the data lines DL.

Exemplary embodiments of the present invention are not limited to the above-mentioned positions for the gate line GL and the data line DL illustrated in FIG. 1. For example, alternatively, in an embodiment, the positions of the gate line GL and the data line DL illustrated in FIG. 1 may be switched such that the data line DL may instead extend in the first direction and the gate line GL may extend in the second direction crossing the first direction.

The TFT TR is electrically connected to the gate line GL and the data line DL. The TFT TR may be disposed in an area where the gate line GL and the data line DL cross with each other.

The TFT TR includes, for example, a gate electrode GE, a source electrode SE and a drain electrode DE. The gate electrode GE may be electrically connected to the gate line GL.

For example, the gate electrode GE may be formed integratedly with the gate line GL. The gate electrode GE may be a protruded portion from the gate line GL.

The source electrode SE may be formed integratedly with the data line DL. The source electrode SE may be a protruded portion from the data line DL.

Figure 2:
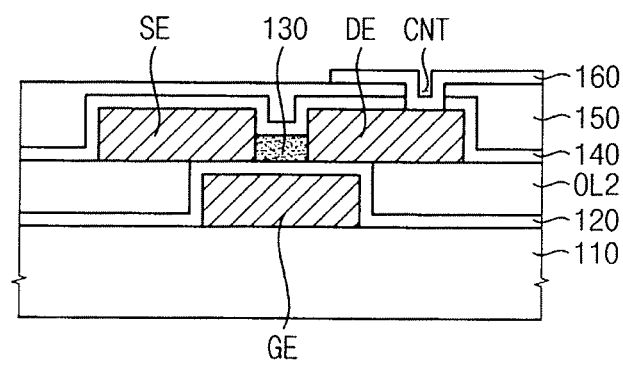
FIG. 2 is a cross-sectional view taken along a line I-I' of FIG. 1.
Figure 3:
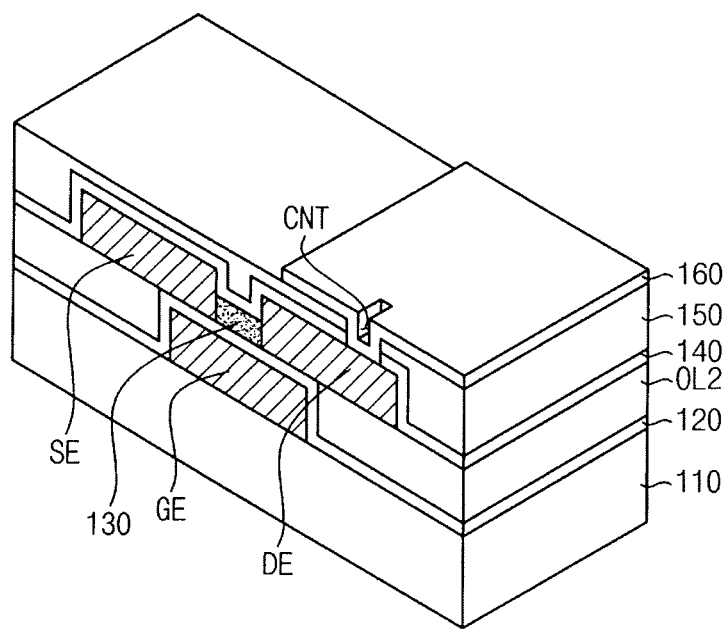
FIG. 3 is a perspective view illustrating a portion of the array substrate of FIG. 1.

The TFT TR is explained in detail referring to FIGS. 2 and 3.

The pixel electrode 160 is electrically connected to the drain electrode DE of the TFT TR. The pixel electrode 160 may be electrically connected to the drain electrode DE through a contact hole CNT. When the TFT TR is turned on, a data voltage applied to the data line DL is transmitted to the pixel electrode 160.

FIG. 2 is a cross-sectional view taken along a line I-I' of FIG. 1. FIG. 3 is a perspective view illustrating a portion of the array substrate of FIG. 1.

Referring to FIGS. 1 to 3, the TFT TR includes, for example, the gate electrode GE, a gate insulating layer 120, the source electrode SE, the drain electrode DE and a semiconductor layer 130.

The gate electrode GE is disposed on the base substrate 110.

The gate electrode GE may have a relatively thick thickness. For example, a thickness of the gate electrode GE may be equal to or greater than about 1 μm. For example, a thickness of the gate electrode GE may be between about 1 μm and about 3 μm.

A gate conductive pattern including the gate electrode GE has a relatively thick thickness so that a resistance of the gate conductive pattern may decrease. Thus, a display panel may be driven in a relatively high speed. In addition, the gate electrode GE has a relatively thick thickness so that an area of the gate conductive pattern may decrease. Thus, an aperture ratio of the display panel may be increased.

The gate electrode GE includes an upper surface, a lower surface and a plurality of side surfaces connecting the upper surface and the lower surface. For example, the gate electrode GE may substantially have a cross section of a rectangle. Alternatively, the gate electrode GE may have a cross section of, for example, a trapezoid.

For example, the gate electrode GE may include one of aluminum (Al), copper (Cu), molybdenum (Mo), titanium (Ti), nickel (Ni), tungsten (W), gold (Au), palladium (Pd), platinum (Pt), chromium (Cr), neodymium (Nd), zinc (Zn), cobalt (Co), any mixtures thereof and any alloys thereof. In addition, the gate electrode GE may also be formed of other materials which include, for example, a transparent conductive material such as an indium tin oxide (ITO), an indium zinc oxide (IZO) and an aluminum doped zinc oxide (AZO). Exemplary embodiments of the present invention are not limited to any of the above-mentioned materials for the gate electrode GE.

The gate electrode GE may have a single layer structure. Alternatively, the gate electrode GE may have, for example, a multi layer structure which includes a plurality of conductive layers or at least one conductive layer and at least one insulating layer.

The gate insulating layer 120 is disposed on the gate electrode GE. The gate insulating layer 120 insulates the gate line GL from the data line DL. In addition, the gate insulating layer 120 insulates the gate electrode GE from the source electrode SE and the drain electrode DE. The gate insulating layer 120 insulates the gate electrode GE from the semiconductor layer 130. The gate insulating layer 120 may be disposed on an entire area of the base substrate 110.

The gate insulating layer 120 has a protruded portion corresponding to a shape of the gate electrode GE.

For example, the gate insulating layer 120 may include a silicon nitride (SiNx), silicon oxide (SiOx), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), lead titanate ($PbTiO_3$), or a combination thereof.

The gate insulating layer 120 may have a single layer structure. Alternatively, the gate insulating layer 120 may have a multi layer structure.

The source electrode SE is disposed on the gate insulating layer 120. The drain electrode DE is disposed on the gate insulating layer 120. The drain electrode DE is spaced apart from the source electrode SE.

The source electrode SE may, for example, partially overlap with the gate electrode GE. The drain electrode DE may, for example, partially overlap with the gate electrode GE.

A portion of the source electrode SE may be disposed on a second organic layer OL2. A portion of the drain electrode DE may be disposed on a second organic layer OL2. For example, a portion of the source electrode SE may make contact with the second organic layer OL2. For example, a portion of the drain electrode DE may make contact with the second organic layer OL2.

The source electrode SE may have, for example, a relatively thick thickness. For example, a thickness of the source electrode SE may be equal to or greater than about 1 μm. For example, a thickness of the source electrode SE may be between about 1 μm and about 3 μm. The drain electrode DE may have, for example, a relatively thick thickness. For example, a thickness of the drain electrode DE may be equal to or greater than about 1 μm. For example, a thickness of the drain electrode DE may be between about 1 μm and about 3 μm. The source electrode SE may have, for example, a thickness substantially equal to a thickness of the drain electrode DE.

A data conductive pattern including the source electrode SE and the drain electrode DE has a relatively thick thickness so that a resistance of the data conductive pattern may decrease. Thus, a display panel may be driven in a relatively high speed. In addition, the data conductive pattern has a relatively thick thickness so that an area of the data conductive pattern may decrease. Thus, an aperture ratio of the display panel may be increased.

A thickness of the gate electrode GE may be, for example, greater than a thickness of the source electrode SE and a thickness of the drain electrode DE. The gate line GL formed with the gate electrode GE may be, for example, longer than the data line DL formed with the source electrode SE and the drain electrode DE. Thus, when the gate conductive pattern is thicker than the data conductive pattern, the display panel may be more beneficial for a high speed driving method.

The source electrode SE includes an upper surface, a lower surface and a plurality of side surfaces connecting the upper surface and the lower surface. For example, the source electrode SE may substantially have a cross section of a rectangle. Alternatively, the source electrode SE may have a cross section of, for example, a trapezoid.

The drain electrode DE includes an upper surface, a lower surface and a plurality of side surfaces connecting the upper surface and the lower surface. For example, the drain electrode DE may substantially have a cross section of a rectangle. Alternatively, the drain electrode DE may have a cross section of, for example, a trapezoid.

For example, the source electrode SE and the drain electrode DE may include one of aluminum (Al), copper (Cu), molybdenum (Mo), titanium (Ti), nickel (Ni), tungsten (W), gold (Au), palladium (Pd), platinum (Pt), chromium (Cr), neodymium (Nd), zinc (Zn), cobalt (Co), any mixtures thereof and any alloys thereof. In addition, the source electrode SE and the drain electrode DE may also be formed of other materials which include, for example, a transparent conductive material such as an indium tin oxide (ITO), an indium zinc oxide (IZO) and an aluminum doped zinc oxide (AZO). Exemplary embodiments of the present invention are not limited to any of the above-mentioned materials for the source electrode SE and the drain electrode DE.

The source electrode SE and the drain electrode DE may have a single layer structure. Alternatively, the source electrode SE and the drain electrode DE may have, for example, a multi layer structure which includes a plurality of conductive layers or at least one conductive layer and at least one insulating layer.

The semiconductor layer 130 is disposed on the gate insulating layer 120. The semiconductor layer 130 makes contact with a side surface of the source electrode SE and a side surface of the drain electrode DE. The semiconductor layer 130 may be disposed on, for example, a plane substantially the same as the source electrode SE and the drain electrode DE. The semiconductor layer 130 may function as a channel layer of the TFT TR.

A height of the semiconductor layer 130 may be less than a height of the source electrode SE and a height of the drain electrode DE. Alternatively, the height of the semiconductor layer 130 may be equal to or greater than the height of the source electrode SE and the height of the drain electrode DE.

The semiconductor layer 130 may include, for example, a soluble semiconductor material. For example, the semiconductor layer 130 may include at least one of an oxide semiconductor, a graphene, a carbon nanotube.

The semiconductor layer 130 may include, for example, an oxide semiconductor. For example, the semiconductor layer 130 may include at least one of a zinc oxide, a tin oxide, a gallium indium zinc (Ga—In—Zn) oxide, an indium zinc (In—Zn) oxide, a indium tin (In—Sn) oxide, indium tin zinc (In—Sn—Zn) oxide and so on. In addition, the semiconductor layer 130 may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor.

The TFT TR may further include, for example, a passivation layer 140 disposed on the source electrode SE, the drain electrode DE and the semiconductor layer 130. The passivation layer 140 may be disposed on an entire area of the base substrate 110.

For example, the passivation layer 140 may include an inorganic insulating material such as, for example, a silicon oxide (SiOx), a silicon nitride (SiNx) or a combination thereof. For example, when the semiconductor layer 130 includes an oxide semiconductor, the passivation layer 140 may include a silicon oxide (SiOx). For example, when the semiconductor layer 130 includes a graphene or a carbon nanotube oxide, the passivation layer 140 may include a silicon nitride (SiNx). Alternatively, the passivation layer 140 may include an organic insulating material such as, for example, benzocyclobutene (BCB), acryl-based resin or a combination thereof.

The passivation layer 140 may have a single layer structure. Alternatively, the passivation layer 140 may have a multi layer structure. In an embodiment, the passivation layer 140 may be omitted.

A contact hole CNT is formed through the passivation layer 140. The drain electrode DE is exposed through the contact hole CNT. The pixel electrode 160 is electrically connected to the drain electrode DE through the contact hole CNT. The pixel electrode 160 may include, for example, a transparent conductive material such as an indium tin oxide (ITO), an indium zinc oxide (IZO) and an aluminum doped zinc oxide (AZO), or a reflective metal such as aluminum (Al), silver (Ag), chromium (Cr) or an alloy thereof.

The TFT TR may further include, for example, a planarizing layer 150 disposed on the passivation layer 140. The planarizing layer 150 may be disposed, for example, on an entire area of the base substrate 110.

The planarizing layer 150 may compensate a difference between a height of a portion where the source electrode SE and the drain electrode DE are formed and a height of a portion where the source electrode SE and the drain electrode DE are not formed. The planarizing layer 150 may also compensate a difference between a height of the source electrode SE and the drain electrode DE and a height of the semiconductor layer 130.

The contact hole CNT is formed through the planarizing layer 150. The drain electrode DE is exposed through the contact hole CNT. The pixel electrode 160 is electrically connected to the drain electrode DE through the contact hole CNT.

FIGS. 4A to 4I are cross-sectional views illustrating a method of manufacturing the array substrate of FIG. 1. FIGS. 5A to 5I are perspective views illustrating a method of manufacturing the array substrate of FIG. 1.

Hereinafter, the method of manufacturing the array substrate may be explained in detail referring to FIGS. 4A to 4I and FIGS. 5A to 5I.

Figure 4A:
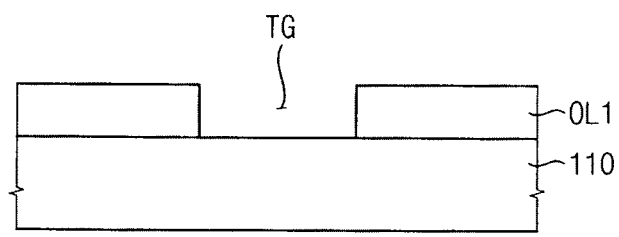
FIGS. 4A to 4I are cross-sectional views illustrating a method of manufacturing the array substrate of FIG. 1.
Figure 5A:
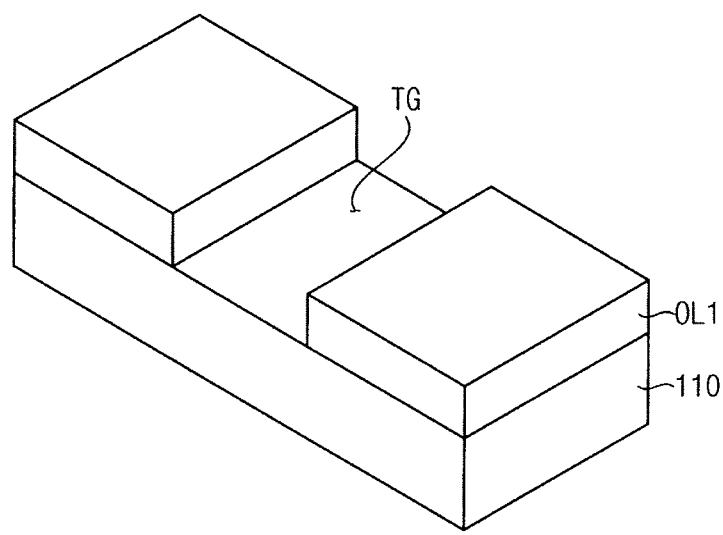
FIGS. 5A to 5I are perspective views illustrating a method of manufacturing the array substrate of FIG. 1.

Referring to FIGS. 4A and 5A, a first organic layer OL1 is formed on the base substrate 110.

The first organic layer OL1 includes an organic material. For example, the first organic layer OL1 may include a parylene, a polyvinyl phenol (PVP), a polyimide, a benzocyclobutene (BCB), or a photoacryl.

A first trench TG is formed in the first organic layer OL1. The first trench TG may be formed using, for example, a mask. The first trench TG may be formed by, for example, a dry etching method. The first trench TG may be formed by, for example, etching the first organic layer OL1 using oxygen ($O_2$) plasma. The first trench TG may be formed by etching the first organic layer OL1 using, for example, argon (Ar) plasma. Alternatively, in an embodiment, the first trench TG in the first organic layer OL1 may be formed by, for example, performing a wet-etching process on the first organic layer OL1.

The first trench TG may substantially have a cross section of, for example, a rectangle. Alternatively, the first trench TG may have a cross section of, for example, a trapezoid.

Figure 4B:
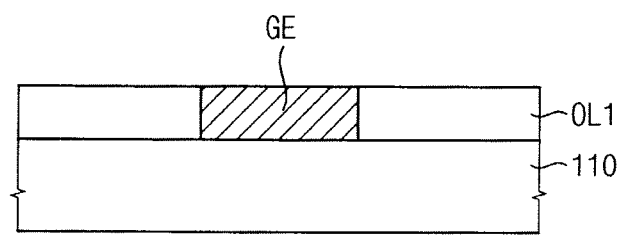
Figure 5B:
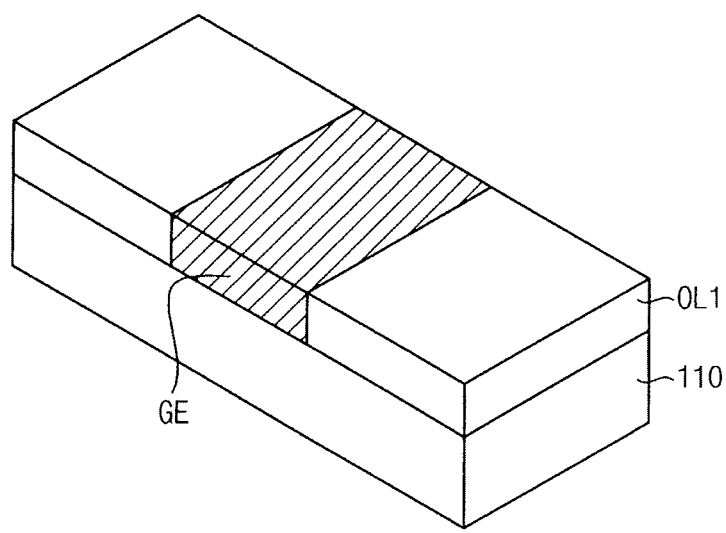

Referring to FIGS. 4B and 5B, the gate electrode GE is formed in the first trench TG of the first organic layer OL1.

The gate electrode GE may be formed by, for example, printing a conductive material in the first trench TG. The conductive material may include, for example, nanoparticles. The conductive material may include, for example, metal nanoparticles such as, for example, silver (Ag) nanoparticles, copper (Cu) nanoparticles, gold (Au) nanoparticles, nickel (Ni) nanoparticles, aluminum (Al) nanoparticles, platinum (Pt) nanoparticles, palladium (Pd) nanoparticles, any mixtures thereof and any alloys thereof.

For example, the gate electrode GE may be formed in the first trench TG by an inkjet printing method. For example, the gate electrode GE may be formed in the first trench TG by a roll to roll printing method. For example, the gate electrode GE may be formed in the first trench TG by a gravure printing method. For example, the gate electrode GE may be formed in the first trench TG by an offset printing method.

After printing the conductive material, the conductive material may be, for example, cured or heated to form the gate electrode GE.

The gate electrode GE is formed by the printing method so that vacuum processes such as a deposition process and a patterning process, and an exposure process for forming the gate electrode GE may not be required. Thus, a manufacturing process of the TFT TR may be simplified and manufacturing costs of the TFT TR may decrease.

Figure 4C:
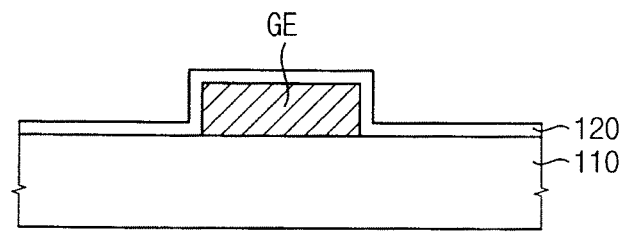
Figure 5C:
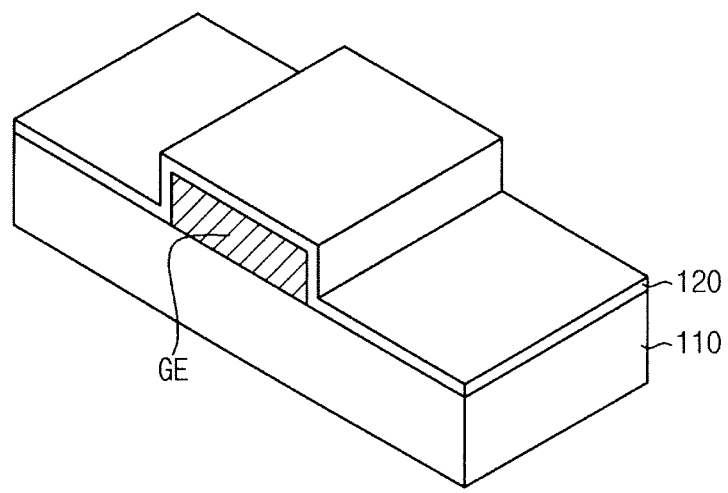

Referring to FIGS. 4C and 5C, the first organic layer OL1 is etched so that the gate electrode GE remains on the base substrate 110.

The gate insulating layer 120 is formed on the base substrate 110 and the gate electrode GE. The gate insulating layer 120 may be formed by, for example, a deposition process.

Figure 4D:
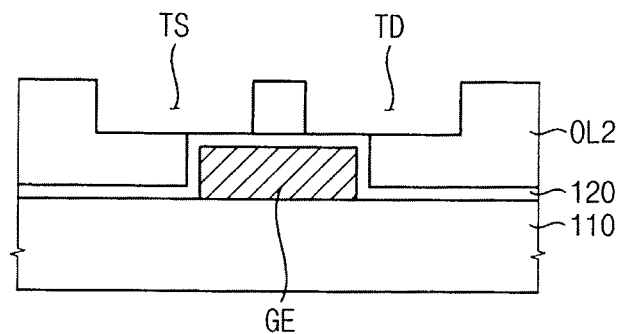
Figure 5D:
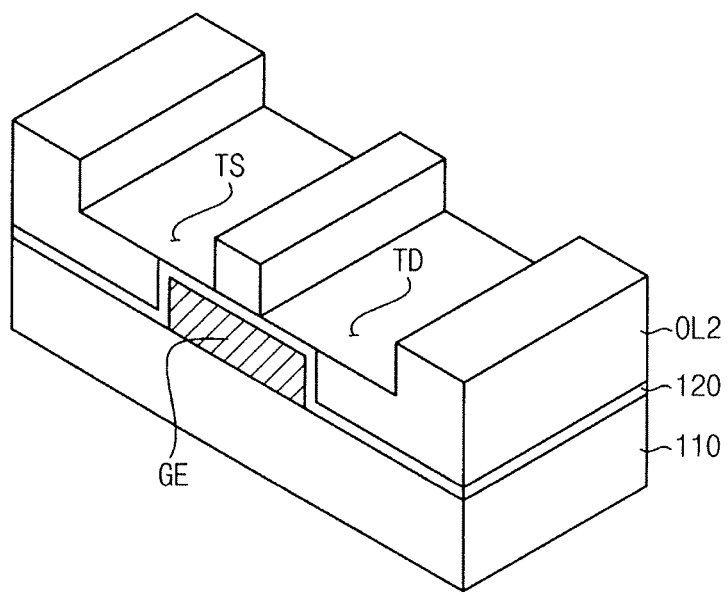

Referring to FIGS. 4D and 5D, the second organic layer OL2 is formed on the gate insulating layer 120.

The second organic layer OL2 includes an organic material. For example, the second organic layer OL2 may include a parylene, a polyvinyl phenol (PVP), a polyimide, a benzocyclo butene (BCB), or a photoacryl.

A second trench TS and a third trench TD are formed in the second organic layer OL2. The second and third trenches TS and TD may be formed using, for example, a mask. The second and third trenches TS and TD may be formed by, for example, a dry etching method. The second and third trenches TS and TD may be formed by, for example, etching the second organic layer OL2 using oxygen ($O_2$) plasma. The second and third trenches TS and TD may be alternatively formed by etching the second organic layer OL2 using, for example, argon (Ar) plasma. Alternatively, in an embodiment, the second trench TS and third trench TD may be formed in the second organic layer OL2 by performing a wet-etching process on the second organic layer OL2.

Each of the second and third trenches TS and TD may substantially have a cross section of, for example, a rectangle. Alternatively, each of the second and third trenches TS and TD may have a cross section of, for example, a trapezoid.

Figure 4E:
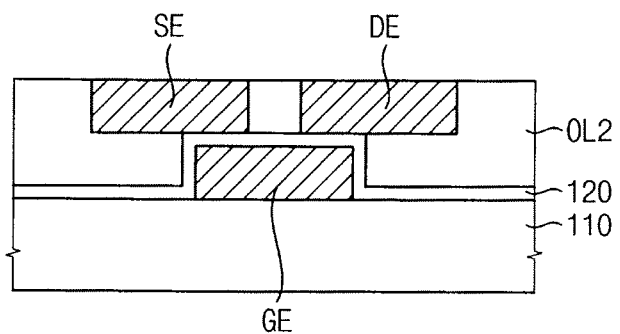
Figure 5E:
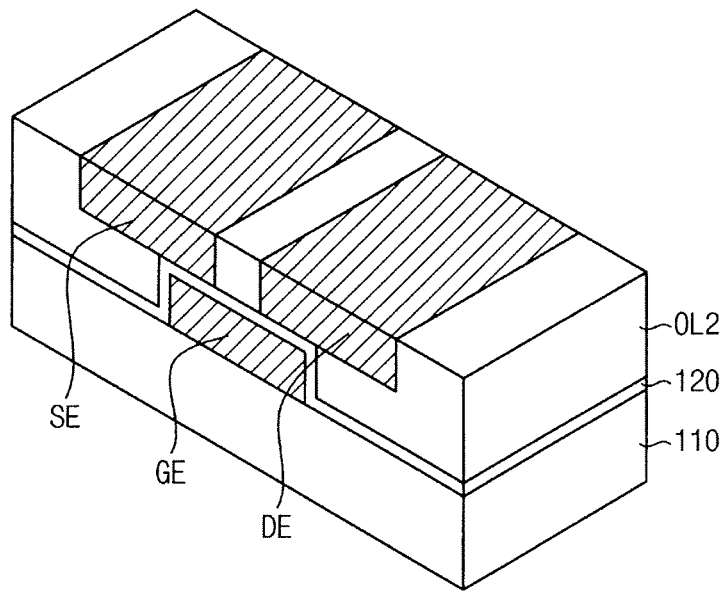

Referring to FIGS. 4E and 5E, the source electrode SE is formed in the second trench TS of the second organic layer OL2. The drain electrode DE is formed in the third trench TD of the second organic layer OL2.

The source electrode SE and the drain electrode DE may be formed by, for example, printing a conductive material in the second and third trenches TS and TD. The conductive material may include, for example, nanoparticles. The conductive material may include, for example, metal nanoparticles such as, for example, silver (Ag) nanoparticles, copper (Cu) nanoparticles, gold (Au) nanoparticles, nickel (Ni) nanoparticles, aluminum (Al) nanoparticles, platinum (Pt) nanoparticles, palladium (Pd) nanoparticles, any mixtures and any alloys thereof.

For example, the source electrode SE and the drain electrode DE may be respectively formed in the second and third trenches TS and TD by an inkjet printing method. For example, the source electrode SE and the drain electrode DE may be respectively formed in the second and third trenches TS and TD by a roll to roll printing method. For example, the source electrode SE and the drain electrode DE may be respectively formed in the second and third trenches TS and TD by a gravure printing method. For example, the source electrode SE and the drain electrode DE may be respectively formed in the second and third trenches TS and TD by an offset printing method.

After printing the conductive material, the conductive material may be, for example, cured or heated to form the source electrode SE and the drain electrode DE.

The source electrode SE and the drain electrode DE are formed by the printing method so that vacuum processes such as a deposition process and a patterning process, and an exposure process for forming the source electrode SE and the drain electrode DE may not be required. Thus, a manufacturing process of the TFT TR may be simplified and manufacturing costs of the TFT TR may decrease.

Figure 4F:
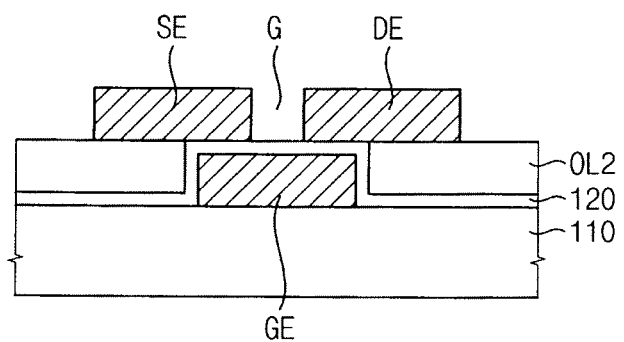
Figure 5F:
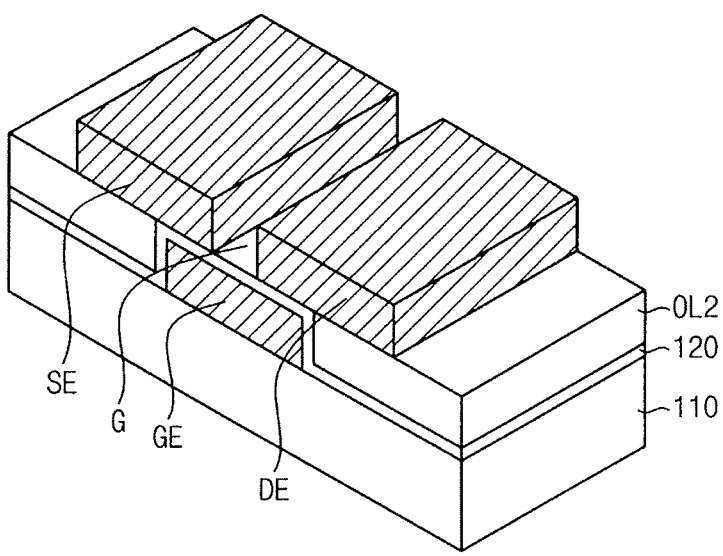

Referring to FIGS. 4F and 5F, the second organic layer OL2 is etched so that a gap G between the source electrode SE and the drain electrode DE is formed. For example, the second organic layer OL2 is etched by a height of the source electrode SE and the drain electrode DE. The gate insulating layer 120 may be exposed between the source electrode SE and the drain electrode DE.

The second organic layer OL2 may have an etching selectivity with the gate insulating layer 120. For example, the second organic layer OL2 includes an organic material and the gate insulating layer 120 includes a silicon nitride (SiNx) or a silicon oxide (SiOx). The second organic layer OL2 may be, for example, dry-etched using oxygen ($O_2$) plasma. The second organic layer OL2 may be, for example, dry-etched using argon (Ar) plasma. In an embodiment, the second organic layer OL2 may, for example, alternatively be wet-etched.

Figure 4G:
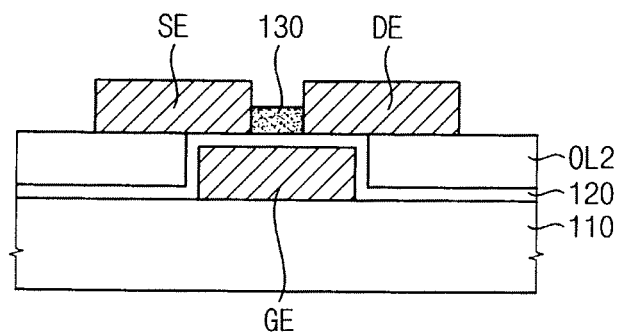
Figure 5G:
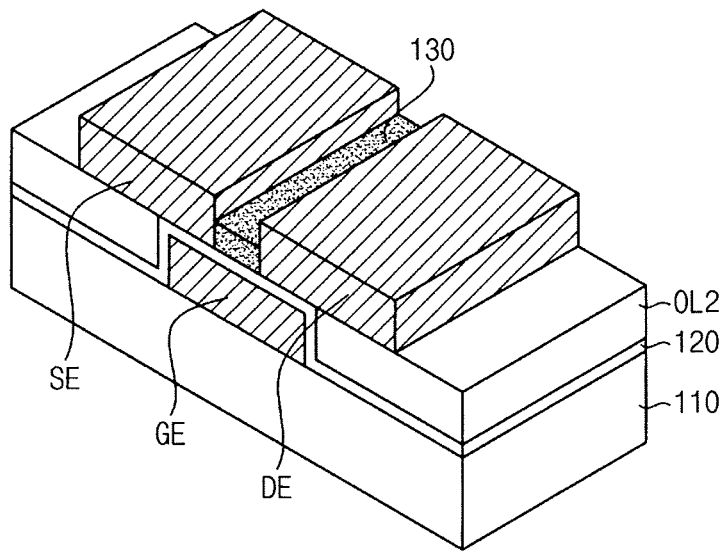

Referring to FIGS. 4G and 5G, the semiconductor layer 130 is formed on the gate insulating layer 120 corresponding to the gap G between the source electrode SE and the drain electrode DE. The semiconductor layer 130 may make contact with a side surface of the source electrode SE and a side surface of the drain electrode DE.

The semiconductor layer 130 may include, for example, a soluble semiconductor material. The semiconductor layer 130 may be formed by, for example, printing a soluble semiconductor material between the source electrode SE and the drain electrode DE.

For example, the soluble semiconductor material may be printed between the source electrode SE and the drain electrode DE by an inkjet printing method. For example, the soluble semiconductor material may be printed between the source electrode SE and the drain electrode DE by a roll to roll printing method. For example, the soluble semiconductor material may be printed between the source electrode SE and the drain electrode DE by a gravure printing method. For example, the soluble semiconductor material may be printed between the source electrode SE and the drain electrode DE by an offset printing method.

The gate insulating layer 120 may have high hydrophilicity. Thus, when the soluble semiconductor material is printed on the gate insulating layer 120, the soluble semiconductor material may be well disposed between the source electrode SE and the drain electrode DE.

After printing the soluble semiconductor material, the conductive material may be, for example, heated to form the semiconductor layer 130.

The semiconductor layer 130 is formed by the printing method so that vacuum processes such as a deposition process and a patterning process, and an exposure process for forming the semiconductor layer 130 may not be required. In addition, the source electrode SE and the drain electrode DE have a relatively thick thickness so that the source electrode SE and the drain electrode DE may function as banks to store the soluble semiconductor material. Thus, a process of forming a self assembled layer ("SAM") which is for forming the soluble semiconductor material at a specific area may be omitted. Therefore, a manufacturing process of the TFT TR may be simplified and manufacturing costs of the TFT TR may decrease.

Figure 4H:
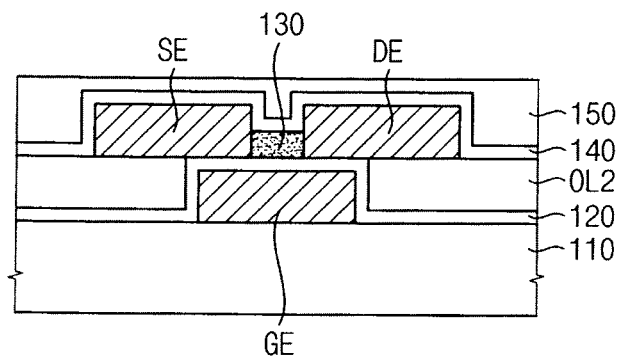
Figure 5H:
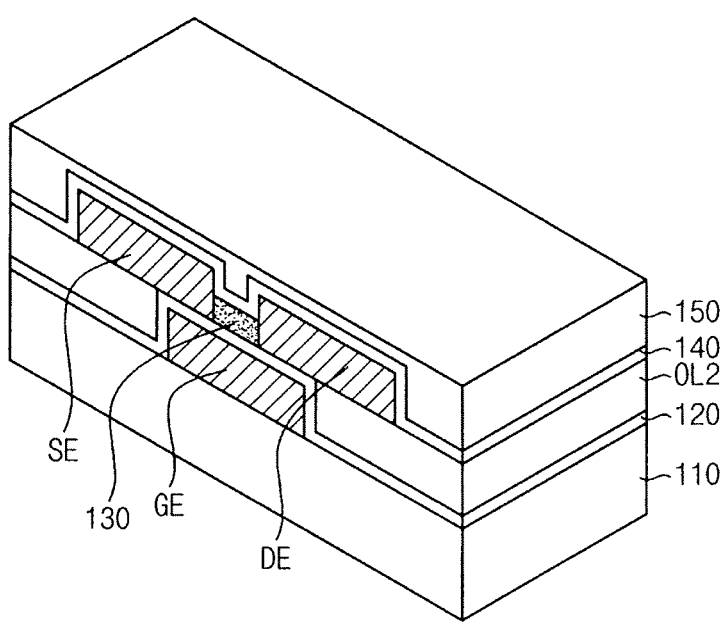

Referring to FIGS. 4H and 5H, the passivation layer 140 is formed on the source electrode SE, the drain electrode DE and the semiconductor layer 130.

The passivation layer 140 is formed on the source electrode SE, the drain electrode DE and the semiconductor layer 130 by, for example, a deposition process.

The planarizing layer 150 may be further formed on the passivation layer 140.

Figure 4I:
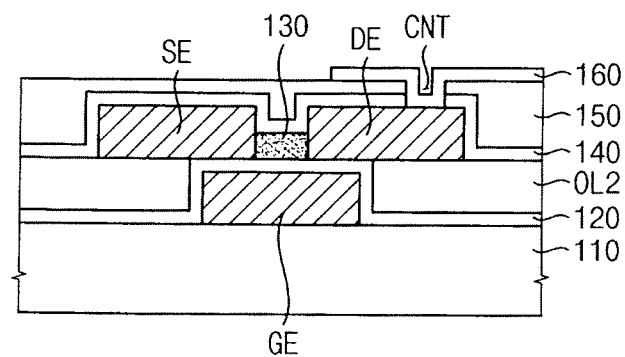
Figure 5I:
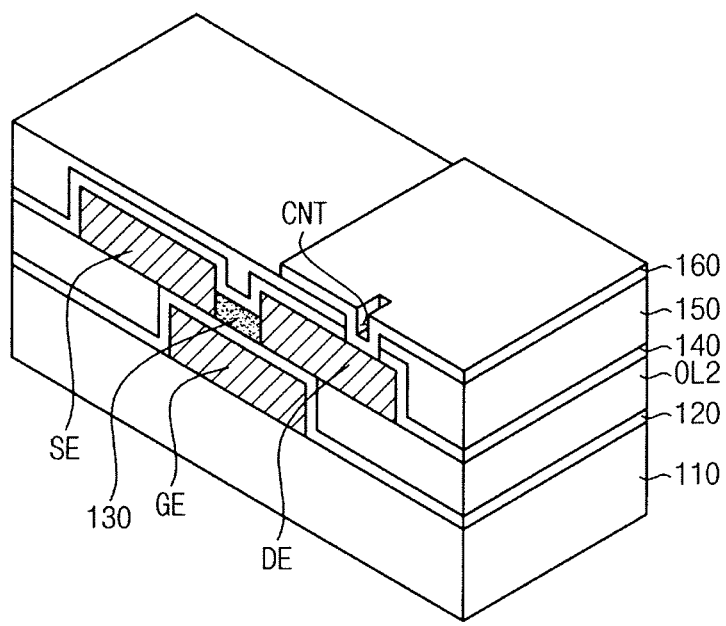

Referring to FIGS. 4I and 5I, the contact hole CNT is formed through the planarizing layer 150 and the passivation layer 140. The contact hole CNT may be formed using, for example, a mask. The drain electrode DE is exposed through the contact hole CNT.

The pixel electrode 160 is formed on the planarizing layer 150. The pixel electrode 160 may be formed using, for example, a mask. The pixel electrode 160 makes contact with the drain electrode DE through the contact hole CNT.

According to the present exemplary embodiment, the gate electrode GE, the source electrode SE and the drain electrode DE have a relatively thick thickness so that resistances of the gate electrode GE, the source electrode SE, and the drain electrode DE may decrease. Accordingly, a driving speed may increase. In addition, an area of the TFT TR may decrease so that an aperture ratio of the display panel may be increased.

Furthermore, when the gate electrode GE, the source electrode SE, and the drain electrode DE are formed, the vacuum processes and the exposure process may be omitted. Thus, a manufacturing process may be simplified and manufacturing costs may decrease.

Furthermore, the source electrode SE and the drain electrode DE have a relatively thick thickness so that a process of forming the SAM which is for forming the soluble semiconductor material at a specific area may be omitted. Thus, a manufacturing process may be simplified and manufacturing costs may decrease.

Figure 6:
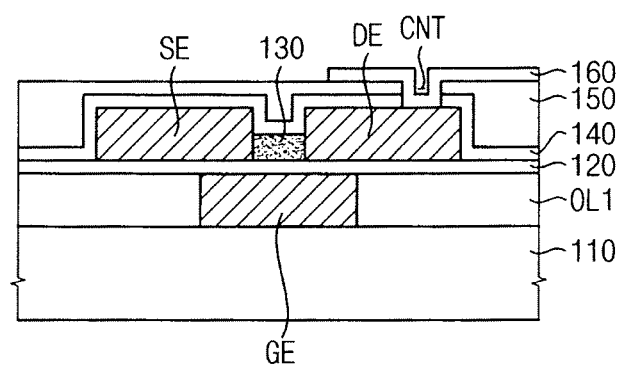
FIG. 6 is a plan view illustrating an array substrate according to an exemplary embodiment of the present invention.
Figure 7:
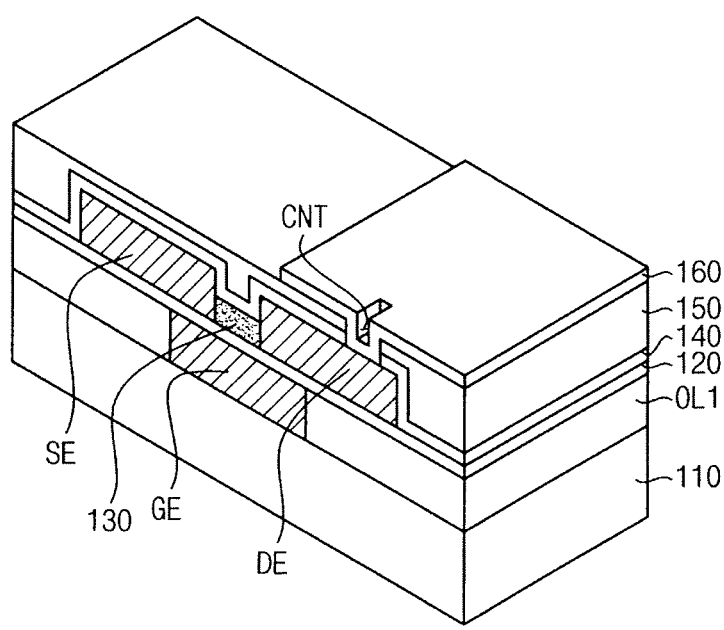
FIG. 7 is a perspective view illustrating a portion of the array substrate of FIG. 6.

FIG. 6 is a plan view illustrating an array substrate according to an exemplary embodiment of the present invention. FIG. 7 is a perspective view illustrating a portion of the array substrate of FIG. 6.

The array substrate of the present exemplary embodiment is substantially the same as the array substrate in FIGS. 1 to 3 except that the array substrate further includes a first organic layer OL1 making contact with a side surface of a gate electrode GE. Thus, the same reference numerals will be used to refer to the same or like parts as those described in FIGS. 1 to 3 and any repetitive explanation concerning the above elements will be omitted.

The method of manufacturing the array substrate of the present exemplary embodiment is substantially the same as the method explained referring to FIGS. 4A to 5I except that a first organic layer OL1 making contact with a side surface of a gate electrode GE is not etched after forming the gate electrode GE in a first trench TG of the first organic layer OL1. Thus, the same reference numerals will be used to refer to the same or like parts as those described in FIGS. 4A to 5I and any repetitive explanation concerning the above elements will be omitted.

Referring to FIGS. 1, 6 and 7, a TFT TR includes, for example, a gate electrode GE, a gate insulating layer 120, a source electrode SE, a drain electrode DE and a semiconductor layer 130.

The gate electrode GE is disposed on the base substrate 110. The gate electrode GE includes an upper surface, a lower surface and a plurality of side surfaces connecting the upper surface and the lower surface. For example, the gate electrode GE may substantially have a cross section of a rectangle. Alternatively, the gate electrode GE may have a cross section of, for example, a trapezoid.

The TFT TR further includes, for example, a first organic layer OL1 making contact with both side surfaces of the gate electrode GE. A height of the gate electrode GE may be, for example, substantially equal to a height of the first organic layer OL1.

The gate insulating layer 120 is disposed on the gate electrode GE. The gate insulating layer 120 insulates the gate line GL from the data line DL. In addition, the gate insulating layer 120 insulates the gate electrode GE from the source electrode SE and the drain electrode DE. The gate insulating layer 120 insulates the gate electrode GE from the semiconductor layer 130. The gate insulating layer 120 may be disposed on an entire area of the base substrate 110.

A portion of the gate insulating layer 120 may be disposed on the first organic layer OL1. The gate insulating layer 120 may have, for example, a flat shape.

The source electrode SE is disposed on the gate insulating layer 120. The drain electrode DE is disposed on the gate insulating layer 120. The drain electrode DE is spaced apart from the source electrode SE.

The semiconductor layer 130 is disposed on the gate insulating layer 120. The semiconductor layer 130 makes contact with a side surface of the source electrode SE and a side surface of the drain electrode DE. The semiconductor layer 130 may be disposed on, for example, a plane substantially the same as the source electrode SE and the drain electrode DE. The semiconductor layer 130 may function as a channel layer of the TFT TR.

The TFT TR may further include, for example, a passivation layer 140 disposed on the source electrode SE, the drain electrode DE and the semiconductor layer 130. The passivation layer 140 may be disposed on an entire area of the base substrate 110.

A contact hole CNT is formed through the passivation layer 140. The drain electrode DE is exposed through the contact hole CNT. A pixel electrode 160 is electrically connected to the drain electrode DE through the contact hole CNT.

The TFT TR may further include, for example, a planarizing layer 150 disposed on the passivation layer 140. The planarizing layer 150 may be disposed on an entire area of the base substrate 110.

The contact hole CNT is formed through the planarizing layer 150. The drain electrode DE is exposed through the contact hole CNT. The pixel electrode 160 is electrically connected to the drain electrode DE through the contact hole CNT.

FIGS. 8A to 8I are cross-sectional views illustrating a method of manufacturing the array substrate of FIG. 6. FIGS. 9A to 9I are perspective views illustrating a method of manufacturing the array substrate of FIG. 6.

Hereinafter, the method of manufacturing the array substrate may be explained in detail referring to FIGS. 8A to 8I and FIGS. 9A to 9I.

Figure 8A:
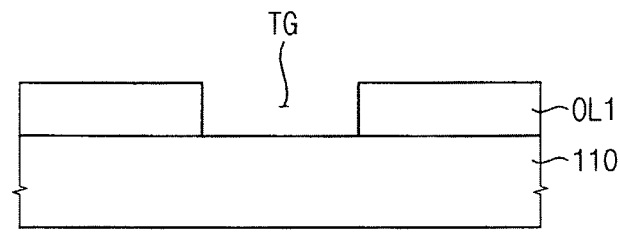
FIGS. 8A to 8I are cross-sectional views illustrating a method of manufacturing the array substrate of FIG. 6.
Figure 9A:
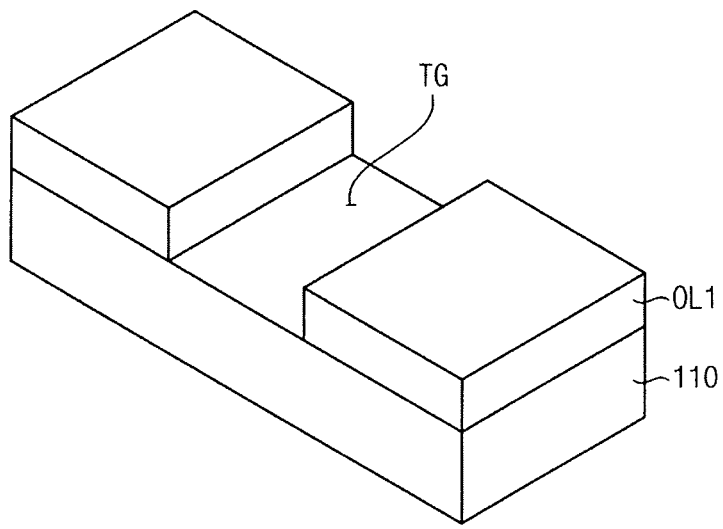
FIGS. 9A to 9I are perspective views illustrating a method of manufacturing the array substrate of FIG. 6.

Referring to FIGS. 8A and 9A, the first organic layer OL1 is formed on the base substrate 110. A first trench TG is formed in the first organic layer OL1.

Figure 8B:
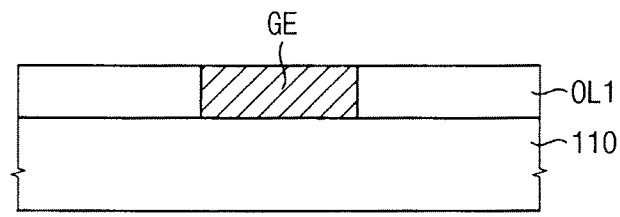
Figure 9B:
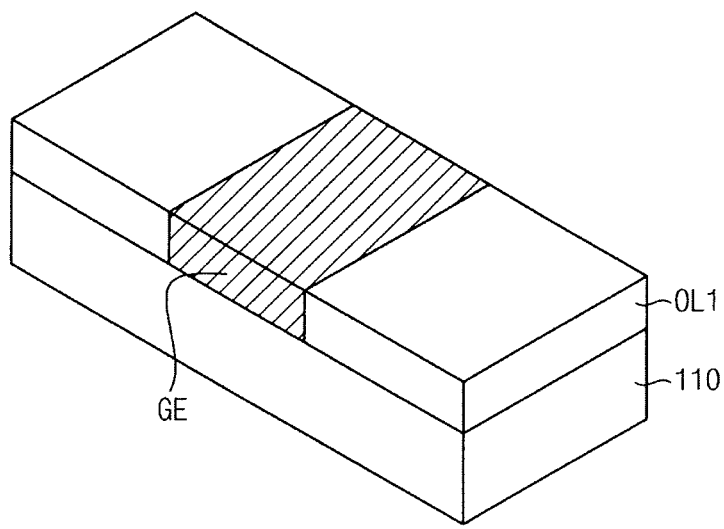

Referring to FIGS. 8B and 9B, the gate electrode GE is formed in the first trench TG of the first organic layer OL1.

Figure 8C:
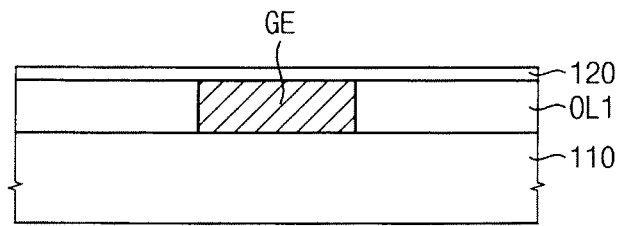
Figure 9C:
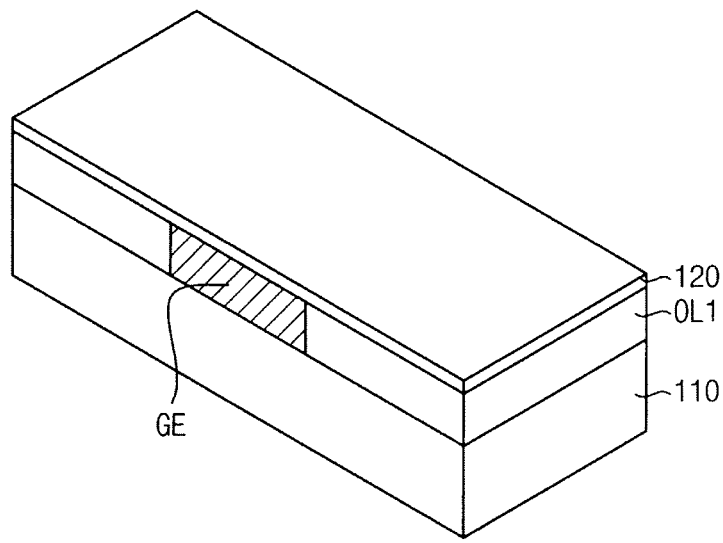

Referring to FIGS. 8C and 9C, the gate insulating layer 120 is formed on the first organic layer OL1 and the gate electrode GE.

After the gate electrode is formed in the first trench TG, the first organic layer OL1 is not etched so that the first organic layer OL1 may plarnarize upper surfaces of the base substrate 110 and the gate electrode GE.

The gate insulating layer 120 having, for example, a flat shape is disposed on the first organic layer OL1 and the gate electrode GE.

Figure 8D:
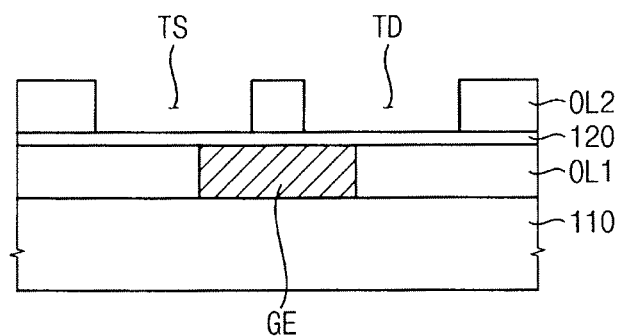
Figure 9D:
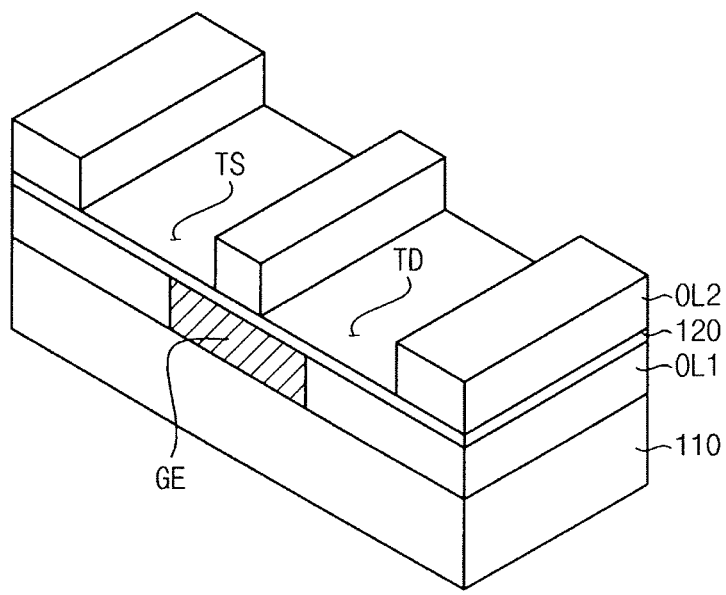

Referring to FIGS. 8D and 9D, the second organic layer OL2 is formed on the gate insulating layer 120. A second trench TS and a third trench TD are formed in the second organic layer OL2.

Figure 8E:
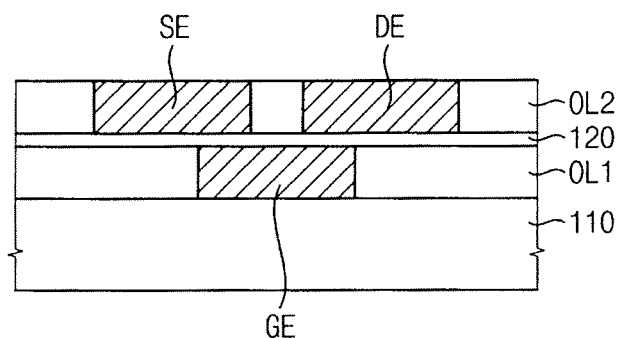
Figure 9E:
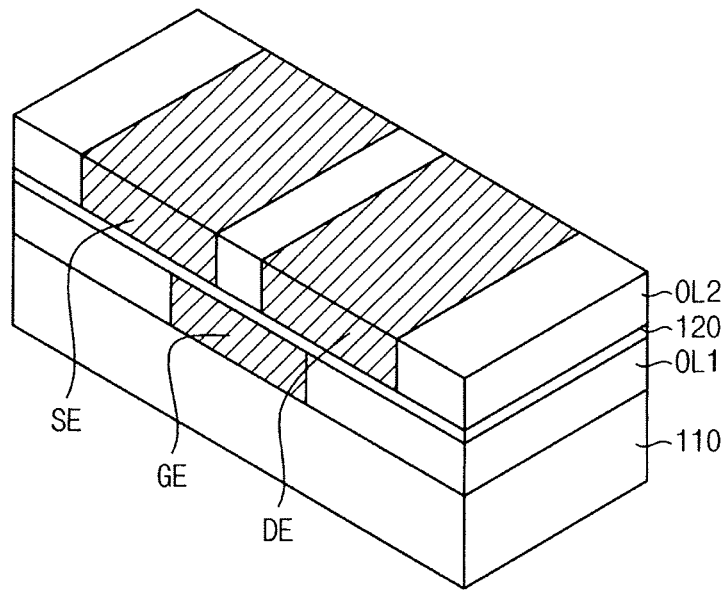

Referring to FIGS. 8E and 9E, the source electrode SE is formed in the second trench TS of the second organic layer OL2. The drain electrode DE is formed in the third trench TD of the second organic layer OL2.

Figure 8F:
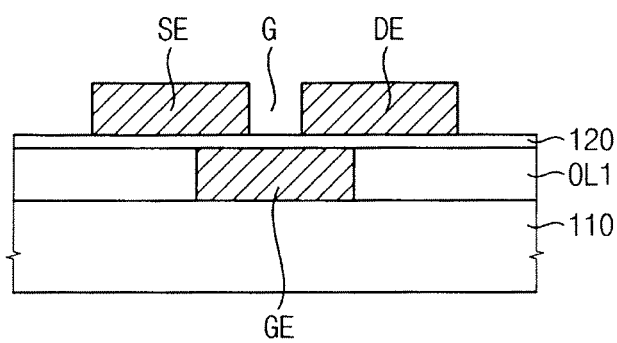
Figure 9F:
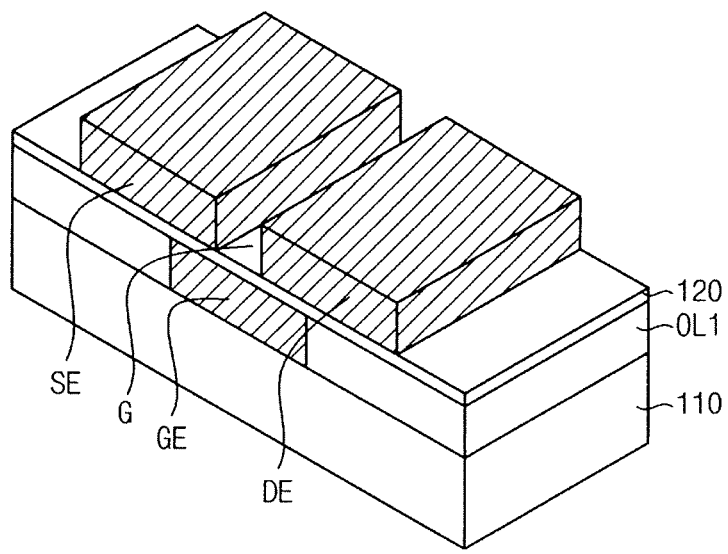

Referring to FIGS. 8F and 9F, the second organic layer OL2 is etched so that a gap G between the source electrode SE and the drain electrode DE is formed.

The gate insulating layer 120 may have an etching selectivity with the second organic layer OL2. Accordingly, when the second organic layer OL2 is etched, the gate insulating layer 120 may function as an etch stopper. Thus, a duration for etching the second organic layer OL2 may not be required to be precisely adjusted.

Figure 8G:
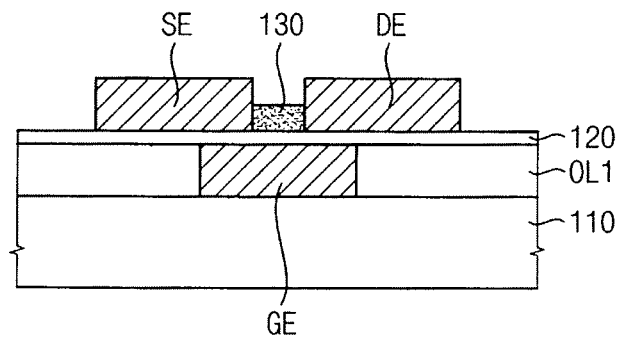
Figure 9G:
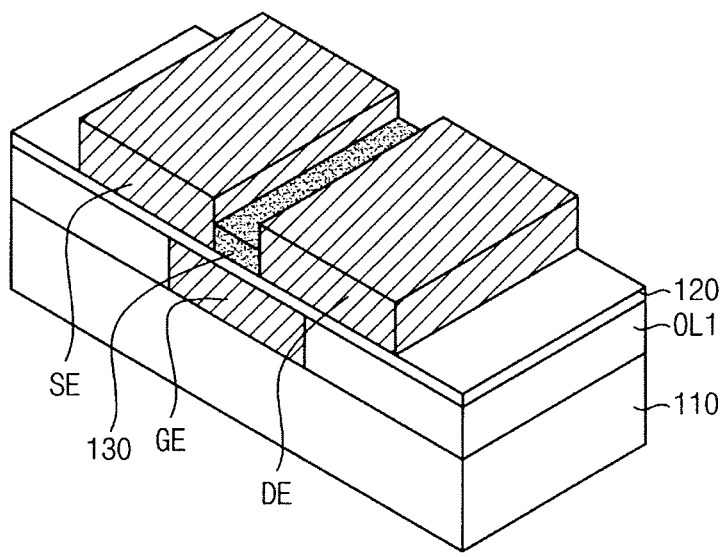

Referring to FIGS. 8G and 9G, the semiconductor layer 130 is formed on the gate insulating layer 120 corresponding to the area between the source electrode SE and the drain electrode DE. The semiconductor layer 130 may make contact with a side surface of the source electrode SE and a side surface of the drain electrode DE.

Figure 8H:
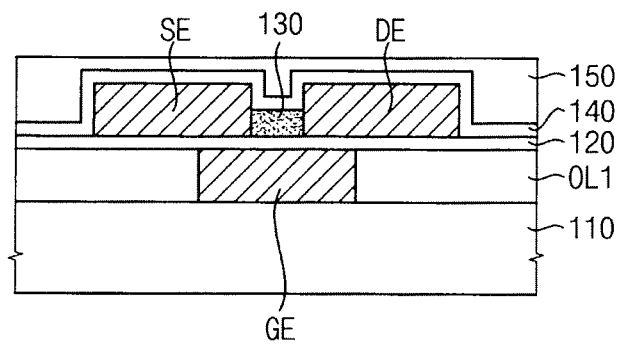
Figure 9H:
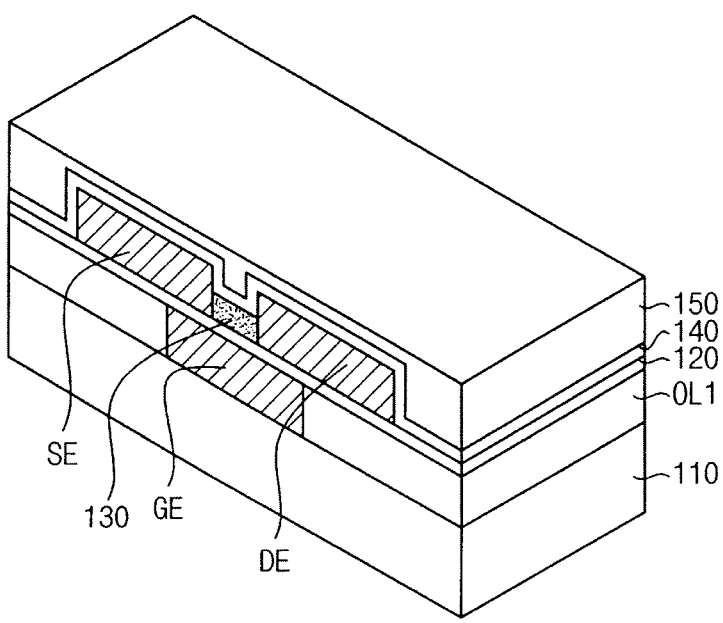

Referring to FIGS. 8H and 9H, the passivation layer 140 is formed on the source electrode SE, the drain electrode DE and the semiconductor layer 130.

The planarizing layer 150 may be further formed on the passivation layer 140.

Figure 8I:
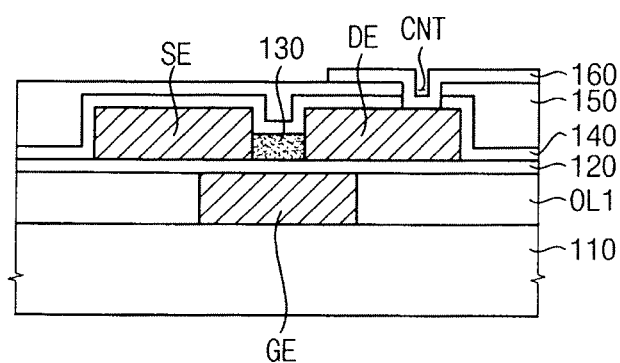
Figure 9I:
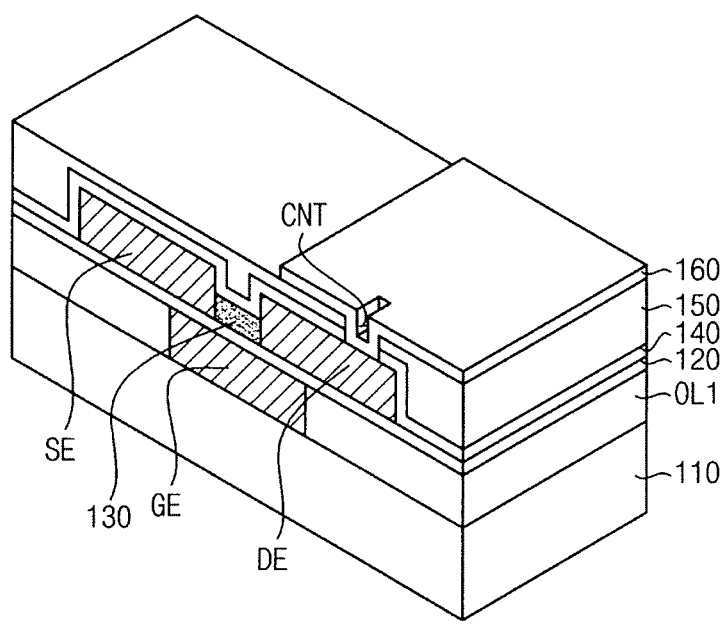

Referring to FIGS. 8I and 9I, the contact hole CNT is formed through the planarizing layer 150 and the passivation layer 140. The drain electrode DE is exposed through the contact hole CNT.

The pixel electrode 160 is formed on the planarizing layer 150. The pixel electrode 160 may be formed using, for example, a mask. The pixel electrode 160 makes contact with the drain electrode DE through the contact hole CNT.

According to the present exemplary embodiment, the gate electrode GE, the source electrode SE and the drain electrode DE have a relatively thick thickness so that resistances of the gate electrode GE, the source electrode SE, and the drain electrode DE may decrease. Accordingly, a driving speed may increase. In addition, an area of the TFT TR may decrease so that an aperture ratio of the display panel may be increased.

Furthermore, when the gate electrode GE, the source electrode SE, and the drain electrode DE are formed, the vacuum processes and the exposure process may be omitted. Thus, a manufacturing process may be simplified and manufacturing costs may decrease.

Furthermore, the source electrode SE and the drain electrode DE have a relatively thick thickness so that a process of forming the SAM which is for forming the soluble semiconductor at a specific area may be omitted. Thus, a manufacturing process may be simplified and manufacturing costs may decrease.

According to an exemplary embodiment of the present invention explained above, the gate electrode GE, the source electrode SE and the drain electrode DE have a relatively thick thickness so that resistances of the gate electrode GE, the source electrode SE, the drain electrode DE and an area of the TFT may decrease.

In addition, the gate electrode GE, the source electrode SE and the drain electrode DE are formed using the organic layer having the trench and the semiconductor layer includes a soluble semiconductor material so that a manufacturing process of the TFT may be simplified and manufacturing costs of the TFT may decrease.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A thin film transistor ("TFT") comprising:
    a gate electrode;
    a gate insulation layer covering the gate electrode;
    an organic layer disposed on the gate insulation layer and surrounding side surfaces of the gate electrode;
    a source electrode;
    a drain electrode spaced apart from the source electrode; and
    a semiconductor layer overlapping with at least a portion of the gate electrode,
    wherein an entirety of a bottom surface of the source electrode, an entirety of a bottom surface of the drain electrode, and an entirety of a bottom surface of the semiconductor layer are disposed on a common plane, and the semiconductor layer has a thickness smaller than that of the source electrode and the drain electrode such that a height of the semiconductor layer is smaller than either a height of the source electrode or a height of the drain electrode,
    wherein at least one of the source electrode and the drain electrode contacts an upper surface of the organic layer and an upper surface of the gate insulation layer.

2. The TFT of claim 1, wherein the semiconductor layer includes a soluble semiconductor material.

3. The TFT of claim 2, wherein the semiconductor layer includes at least one of an oxide semiconductor, a graphene or a carbon nanotube.

4. The TFT of claim 1, wherein the semiconductor layer is disposed on a plane substantially the same as the source electrode and the drain electrode.

5. The TFT of claim 1, wherein a thickness of the source electrode is between about 1 μm and about 3 μm, and wherein a thickness of the drain electrode is between about 1 μm and about 3 μm.

6. The TFT of claim 5, wherein a thickness of the gate electrode is between about 1 μm and about 3 μm.

7. The TFT of claim 1, wherein a thickness of the gate electrode is greater than a thickness of the source electrode and a thickness of the drain electrode.

8. The TFT of claim 1, further comprising a passivation layer disposed on the source electrode, the drain electrode and the semiconductor layer.

9. The TFT of claim 8, wherein the passivation layer includes a silicon oxide.

10. A method of manufacturing a thin film transistor ("TFT"), the method comprising:
    forming a first organic layer having a first trench;
    forming a gate electrode in the first trench of the first organic layer after forming the first organic layer having the first trench;
    forming a gate insulating layer on the gate electrode;
    forming a source electrode in a second trench disposed in a second organic layer located on the gate insulating layer and a drain electrode in a third trench disposed in the second organic layer, wherein the drain electrode is spaced apart from the source electrode on the gate insulating layer; and
    forming a semiconductor layer on the gate insulating layer, wherein the semiconductor layer contacts with a side surface of the source electrode and a side surface of the drain electrode.

11. The method of claim 10, wherein the forming of the semiconductor layer comprises printing a soluble semiconductor material between the source electrode and the drain electrode.

12. The method of claim 11, wherein the semiconductor layer includes at least one of an oxide semiconductor, a graphene or a carbon nanotube.

13. The method of claim 10, wherein the semiconductor layer is disposed on a plane substantially the same as the source electrode and the drain electrode.

14. The method of claim 10, wherein the forming of the gate electrode comprises printing a conductive ink in the first trench.

15. The method of claim 10, wherein the forming of the source electrode and the drain electrode comprises printing a conductive ink in the second trench and the third trench, respectively.

16. The method of claim 10, wherein a thickness of the source electrode is between about µm and about 3 µm, and wherein a thickness of the drain electrode is between about 1 µm and about 3 µm.

17. The method of claim 16, wherein a thickness of the gate electrode is between about 1 µm and about 3 µm.

18. The method of claim 10, wherein a thickness of the gate electrode is greater than a thickness of the source electrode and a thickness of the drain electrode.

19. The method of claim 10, further comprising forming a passivation layer on the source electrode, the drain electrode and the semiconductor layer.

20. The method of claim 19, wherein the passivation layer includes a silicon oxide.

21. The method of claim 10, wherein the first organic layer contacts with opposing side surfaces of the gate electrode.

22. The method of claim 10, wherein the gate insulating layer is in direct physical contact with the top surface of the first organic layer and the top surface of the gate electrode, and wherein the gate electrode is substantially a same height as the first organic layer.

23. The method of claim 10, wherein a thickness of the gate electrode is equal to or greater than about 1 µm, wherein a thickness of the source electrode is equal to or greater than about 1 µm and wherein a thickness of the drain electrode is equal to or greater than about 1 µm.

* * * * *